US006660605B1

United States Patent
Liu

(10) Patent No.: US 6,660,605 B1
(45) Date of Patent: Dec. 9, 2003

(54) METHOD TO FABRICATE OPTIMAL HDD WITH DUAL DIFFUSION PROCESS TO OPTIMIZE TRANSISTOR DRIVE CURRENT JUNCTION CAPACITANCE, TUNNELING CURRENT AND CHANNEL DOPANT LOSS

(75) Inventor: Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/292,722

(22) Filed: Nov. 12, 2002

(51) Int. Cl.$^7$ .............................................. H01L 21/336
(52) U.S. Cl. ...................... 438/307; 438/305; 438/303; 438/301
(58) Field of Search ................................ 438/305, 307, 438/303, 528, 301, 217, 291, 163

(56) References Cited

U.S. PATENT DOCUMENTS

| | | | | | |
|---|---|---|---|---|---|
| 4,818,714 | A | * | 4/1989 | Haskell | 438/231 |
| 6,117,737 | A | | 9/2000 | Wang et al. | |
| 6,121,091 | A | | 9/2000 | Wang | |
| 6,133,082 | A | * | 10/2000 | Masuoka | 438/227 |
| 6,137,137 | A | | 10/2000 | Wu | |
| 6,232,166 | B1 | * | 5/2001 | Ju et al. | 438/231 |
| 6,300,205 | B1 | * | 10/2001 | Fulford et al. | 438/303 |
| 6,348,387 | B1 | * | 2/2002 | Yu | 438/303 |
| 6,362,063 | B1 | * | 3/2002 | Maszara et al. | 438/307 |
| 6,368,928 | B1 | * | 4/2002 | Wang et al. | 438/307 |
| 6,410,410 | B1 | * | 6/2002 | Feudel et al. | 438/547 |
| 6,432,763 | B1 | * | 8/2002 | Yu | 438/217 |
| 6,437,406 | B1 | | 8/2002 | Lee | |
| 6,458,665 | B1 | | 10/2002 | Kim | |
| 6,472,282 | B1 | * | 10/2002 | Yu | 438/305 |
| 6,521,502 | B1 | * | 2/2003 | Yu | 438/305 |
| 6,555,437 | B1 | * | 4/2003 | Yu | 438/300 |
| 6,563,151 | B1 | * | 5/2003 | Shin et al. | 257/288 |
| 6,586,303 | B2 | * | 7/2003 | Wu | 438/262 |
| 2002/0068409 | A1 | | 6/2002 | Chou et al. | |
| 2002/0151146 | A1 | | 10/2002 | Schmidt | |

OTHER PUBLICATIONS

"MOS Scaling: Transistor Challenges for the 21$^{st}$ Century", Scott Thmpson, Paul Packan and Mark Bohr, Intel Technology Journal, Third Quarter, 1998, pp. 1–19.

* cited by examiner

Primary Examiner—John F. Niebling
Assistant Examiner—Walter L. Lindsay, Jr.
(74) Attorney, Agent, or Firm—Jacqueline J. Garner; W. James Brady, III; Frederick J. Telecky, Jr.

(57) ABSTRACT

Methods are discussed for forming a transistor comprising a source/drain region having both a graded HDD portion and a sharp HDD portion in a semiconductor substrate. The method comprises a dual diffusion process, wherein a gate structure is provided over the semiconductor substrate having an offset spacer associated therewith. A first dopant material is implanted around the gate structure in the source/drain area to form a grade-HDD region in the substrate that is aligned to the offset spacer. A sidewall spacer is formed around the gate structure and covers the offset spacer. A second dopant material is then implanted in the source/drain area to form a source/drain region in the substrate aligned to the sidewall spacer, and the device is thermally processed in a first anneal. The sidewall spacer and the offset spacer are removed from the gate structure. A third dopant material is implanted in the source/drain area to form a sharp HDD region aligned to the gate structure, and the device is flash annealed in a second anneal.

18 Claims, 11 Drawing Sheets

METHOD TO FABRICATE OPTIMAL HDD WITH DUAL DIFFUSION PROCESS TO OPTIMIZE TRANSISTOR DRIVE CURRENT JUNCTION CAPACITANCE, TUNNELING CURRENT AND CHANNEL DOPANT LOSS

FIELD OF INVENTION

The present invention relates generally to semiconductor devices and more particularly to methods for forming transistor source/drain regions having a sharp HDD portion buried within a graded HDD portion in the fabrication of semiconductor devices.

BACKGROUND OF THE INVENTION

MOS transistors are found in many modern semiconductor products where switching and/or amplification functions are needed. Many manufacturing processes and techniques have been developed for fabricating MOS devices in semiconductor substrate materials such as silicon and the like. In recent years, the size of transistors and other components have steadily decreased to submicron levels in order to facilitate higher device densities in semiconductor products. At the same time, many new applications have created a need to operate transistors and other semiconductor devices at lower power and voltage levels. Thus, whereas previous MOSFET devices were designed to operate at voltages of 5 or more volts, newer applications may require such devices to operate from DC supplies of around 3 volts or less. In addition, switching speed requirements of MOS transistors continue to increase in order to facilitate faster and improved product performance. Accordingly, efforts continue to be made to design semiconductor devices, such as MOSFET transistors, which occupy less physical space, consume less power, and operate at higher switching speeds and at lower voltages.

MOS transistors include a conductive gate overlying a channel region of the substrate with a thin gate dielectric, typically oxide, therebetween. Source and drain regions of the substrate (sometimes referred to as junction regions) are doped with impurities on opposite sides of the channel, wherein the source/drain regions of NMOS devices are doped with n-type impurities (e.g., As, Sb, P, etc.) and PMOS devices are doped using p-type impurities (e.g., B, Ga, In, etc.). The length of the gate structure overlying the channel typically dictates the physical channel length thereunder. The source and drain dopants are typically implanted into the silicon substrate using ion implantation systems, wherein the dosage and energy of the implanted ions may be varied depending upon the desired dopant concentration, depth, and profile. The ion dosage generally controls the concentration of implanted ions for a given semiconductor material, and the energy level of the ions determines the distance of penetration or depth of the implanted ions (e.g., the junction depth).

One specific type of implant is the "quad high-angle implant" (QHA), which may be performed on the MOS device, wherein four separate high angle implants are done on the device wafer. Each implant is typically performed on the wafer held in a position, then rotationally indexed by 90 degrees.

Following implantation, the dopant atoms in the source/drain regions occupy interstitial positions in the substrate lattice, and the dopant atoms must be transferred to substitutional sites to become electrically active. This process is sometimes referred to as "activation", and is accomplished by high temperature annealing in an inert ambient such as argon. The activation anneal process also causes diffusion of implanted dopant species downward and laterally in the substrate, wherein the effective channel length becomes less than the gate width. As device sizes continue to shrink, the channel lengths continue to be scaled downward, wherein short channel effects become significant.

In addition to short channel effects, hot carrier effects are also experienced in short channel devices. For example, during saturation operation of a MOS transistor, electric fields are established near the lateral junction of the drain and channel regions. This field causes channel electrons to gain kinetic energy and become "hot". Some of these hot electrons traveling to the drain are injected into the thin gate dielectric proximate the drain junction. The injected hot carriers, in turn, often lead to undesired degradation of the MOS device operating parameters, such as a shift in threshold voltage, changed transconductance, changed drive current/drain current exchange, and device instability.

To combat channel hot carrier effects, drain extension regions are commonly formed in the substrate, which are variously referred to as double diffused drains (DDD), lightly doped drains (LDD), and moderately doped drains (MDD). These drain extension regions absorb some of the potential into the drain and away from the drain/channel interface, thereby reducing channel hot carriers and the adverse performance degradation associated therewith.

The success of the MOS transistor has been partially due to the capability of the MOS transistor to take advantage of the lateral scaling improvements in the technologies. Lateral scaling results in simultaneous improvements in both the performance and the packing density of the devices. Although generalized scaling has served well for the last few decades, many of the technology advances that allow the devices to continue improving the performance and the packing density are approaching fundamental physical limitations.

Gate oxide thickness, junction scaling, and well engineering in MOS devices has enabled channel length scaling by improving short channel characteristics. By changing the doping profile in the channel region, the distribution of the electric field and potential contours can be changed. The goal is to optimize the channel profile to minimize the off-state leakage while maximizing the linear and saturation drive currents. Channel doping optimization can improve the circuit gate delay, for example, by about 10% for a given technology. Super Steep Retrograde Wells (SSRW) and halo implants (or pocket implants) have been used as a means to scale the channel length and increase the transistor drive current without causing an increase in the off-state leakage current.

The halo architecture creates a localized 2-D graded dopant distribution near the source/drain (S/D) regions and extends under the channel. Halos are generally known for their ability to stop unwanted source/drain leakage conduction, or punchthrough current, and as such, are sometimes referred to as "punchthrough stoppers".

Punchthrough current may also be seen as a parasitic current path existing between the drain and source, which is poorly controlled by the gate contact since the current path is located deeper in the bulk (substrate) farther from the gate. The actual amount of punchthrough current depends mainly on the potential distribution under the channel and on the S/D junction depths. As the effective channel length gets shorter, the S/D depletion regions also get closer. Punchthrough may then be established when the effective channel length is decreased to roughly the sum of the two junction depletion widths. One way to reduce the punchthrough current is to increase the overall bulk doping level. As a result, the drain and source depletion regions become smaller and may not establish a parasitic current path. Since a higher bulk doping increases the subthreshold swing, this method is not the most efficient way to reduce drain-source leakage.

Currently, super-sharp (SS) highly doped drain (HDD) profile junctions are commonly used to minimize channel resistance, extension region resistance, and source-drain resistance; (Rds) in a transistor. However, the SS HDD junction also increases the body-to-source/drain junction capacitance (Cqbw).

By contrast, graded HDD junction profiles have also been used to improve device performance; particularly with today's deep sub-micron technologies, graded HDD profiles improve circuit performance with lower Cjbw or tunneling current. Graded HDD junctions may also advantageously lower the body-to-source/drain junction capacitance Cjbw, lower the band-to-band tunneling current, and reduce channel dopant segregation into the HDD (S/D) region. Graded HDD junctions may also permit better trimming (compensation) of the HDD profile with super-sharp retrograde SSR channels, reduce punchthrough current (subsurface DIBL), and lower the pocket dosage requirement. However, the graded HDD junction may have a higher source-drain resistance (Rds), because the graded region represents a high resistance region.

Segregation, in one instance, is the amount of channel dopant that diffuses into the HDD at the junction. That is, dopant segregation implies that there is a preferable region for migration of dopant atoms. For example, channel boron (−) dopants may tend to migrate across a junction toward an HDD arsenic (+) dopant concentration over time and temperature. However, with junctions that are more graded, there is less tendency for the boron dopants to migrate toward the HDD arsenic.

Thus attaining higher switching speeds in a MOS transistor, is seemingly at odds with either the super-sharp HDD or the graded HDD junction, as a higher drive current (Ids) is desirable, but at a lower body-to-source/drain junction capacitance Cjbw.

Several prior art methods have been used for forming transistor source/drain regions having a sharp HDD portion or a graded HDD portion in a semiconductor device. Before comparing these prior art methods, however, some relevant issues will be discussed in association with a conventional MOS transistor device of FIG. 1. FIG. 1 illustrates a conventional profile for the MOS transistor utilizing a drain extension or "tail".

The MOS transistor 1 comprises a gate 2 having a channel length 2*a*, a gate-oxide 3, and a semiconductor substrate 4 with source/drain regions 5 on either side of a channel region 6. In the conventional MOS transistor 1, a deep source/drain junction 8 having a depth 8*a* is typically formed alongside a gate structure by implantation. The S/D region 5 has a drain extension or "tail" 10 which extends into and underlying the gate 2 and gate channel area 6. An enlarged detail 12 further illustrates the area surrounding the drain extension tail 10, and the manner in which the drain extension shortens the effective channel length by comparison to a transistor without this drain extension tail feature 10.

For example, FIG. 2, illustrates a profile for a conventional MOS transistor 20 similar to that of FIG. 1, but not utilizing a drain extension tail (e.g., 10 of FIG. 1), and as such may not be described in full detail again for the sake of brevity.

In FIG. 2, the MOS transistor 20 comprises a gate 22 having a channel length 22*a*, a gate-oxide 23, and a semiconductor substrate 24 with source/drain regions 25 on either side of a channel region 26. In the conventional MOS transistor 20, the S/D region 25 does not have a drain extension or "tail", thus has a correspondingly longer channel length. Beneficially, a longer channel length minimizes the off-state leakage current by increasing the distance between the subsurface S/D regions, which reduces the subsurface leakage between the source and drain and other short channel effects.

Referring back to FIG. 1, in the fabrication process of the conventional MOS transistor 1, isolation structures (not shown) are formed in a substrate 4, and a gate oxide 3 (e.g., gate dielectric) is formed. A layer of polysilicon is deposited over the gate oxide 3, and is then patterned to form a polysilicon gate structure 2. Then, an LDD implant is performed, wherein drain extension regions are implanted using (e.g., As).

Since dopant impurities scatter mobility carriers and degrade linear drive current, ideally the dopant concentration near the substrate surface 4 and channel region 6 would be low. However, as previously discussed, drain extension regions or tails tend to require additional drain dopant compensation, which produces a higher bulk doping concentration in the channel region, and results in reduced carrier mobility. In addition, dopants from the drain extension of the conventional MOS transistor 1 may migrate further into the channel region further shortening the previously shortened channel length adding to the possible subsurface leakage current paths.

With a graded HDD, part of the dopant will also be implanted and migrate into the channel to form a tail in the channel region. If, for example, this dopant concentration in the tail is +1N, then an equal and opposite polarity dopant concentration of −1N would be needed to compensate or trim the dopant profile in this tail. Further, to control or at least maintain the threshold voltage Vt of the MOS transistor, another −1N dopant concentration may be added to this tail area of the channel region. However, since carrier mobility is actually affected by the gross or bulk doping concentration, the carrier mobility is affected by the gross dopant concentration of about 3N.

For example, a tail may receive an arsenic (+) dopant concentration of 1E18. To compensate for this dopant (dopant trimming), a boron (−) 1E18 dopant concentration may need to be added in the channel region. Then, to control or maintain the threshold voltage Vt of the MOS transistor, a second boron (−) 1E18 dopant concentration may need to be added. However, since the carrier mobility is actually affected by the gross or bulk doping concentration, the carrier mobility is affected by the gross dopant concentration of about 3E18. Thus, a super-sharp HDD is desirable to minimize the Rds, the scattering of carrier mobility, and the degradation of linear drive current when dopant impurities are added.

A second prior art method for forming transistor source/drain regions is the "Dual HDD process", which creates two steps in the profile according to FIG. 3.

FIGS. 3 illustrates a prior art method of forming a transistor source/drain region in a MOS transistor 30 according to the "Dual HDD process". The MOS transistor 30 comprises a gate structure 32 formed over a semiconductor substrate 34. Gate structure 32 comprises a gate-oxide material layer 36 formed over the semiconductor substrate 34, a polysilicon material layer 38 formed over the gate-oxide 36. This process is similar to other conventional processes, except that two HDD spacers and implant processes are used in the source/drain region 39.

In the "Dual HDD process", a first HDD spacer 40 comprising an insulative material is formed surrounding the gate 32, and a first HDD implant 42 is performed. Then, a second HDD spacer 44 comprising an insulative material is formed surrounding the first HDD spacer 40, and a second HDD implant 46 is performed. Then, a deep S/D spacer 48 comprising an insulative material is formed surrounding the second HDD spacer 44, and a deep S/D implant 49 is performed. This process relies on a final activation anneal after the deep S/D implant, which produces either a generally sharp profile across all junctions, or a generally graded profile across all junctions depending on the time and temperature used in the anneal process. It is desired, however, for a sharp profile only at the surface and graded elsewhere. The "Dual HDD process" method is therefore generally unsuitable for the high device density and high-speed semiconductor applications contemplated.

A third prior art method for forming transistor source/drain regions is the "Disposable spacer process", which seeks to produce the sharpest possible HDD profile. The "Disposable spacer process" method is based on the concept that the HDD region is the final implant process before the final activation anneal.

In this process, the sharp HDD profile at the surface benefits drive current, but also produces increased Cjbw (small depletion width), increased tunneling current (due to the sharp junction), a smaller spacing between HDD regions (less trimming by super-sharp retrograde channel doping), and interstitial dopant loss from the channel into HDD regions. Dopant is lost from the channel into the HDD regions because the sharper surface profile of this method produces a higher attraction electric field for the dopant. The "Disposable spacer process" method is therefore also generally unsuitable for the high device density and high-speed semiconductor applications contemplated.

A fourth prior art method for forming transistor source/drain regions is the "HDD TIP process", which is similar to the second prior art method of the "Dual HDD process", except that the spacer step is skipped in place of a blanket implant step. As such, in the "HDD TIP process", the blanket implant is performed without the first spacer process, saving the processing steps for the first HDD process. Since this method uses a blanket implant, it also saves the cost of two additional mask steps. However, it not only has all the disadvantages of the Dual HDD process, but also results in a slightly inferior PMOS or NMOS as the blanket TIP dopant and-the substrate dopant tend to counter dope each other. The "HDD TIP process" is therefore also generally unsuitable for the applications contemplated.

A fifth prior art method for forming transistor source/drain regions is the "Dual Dopant process". The "Dual Dopant process" is typically used in older technology NMOS devices. Two species of different diffusivity are used in the HDD implant (e.g., arsenic and phosphorus). The high solid solubility and low diffusivity arsenic is used to produce the main conducting part of the HDD, whereas the high diffusivity phosphorus is used to produce a tail beyond the main conducting part of the HDD. This tail smoothes the HDD profile gradient and reduces hot carriers, tunneling current, and junction capacitance. Unfortunately, it will also degrade the drive current. The "Dual Dopant process" is therefore also generally unsuitable for the applications contemplated.

In addition, as device densities and operational speeds continue to increase, reduction of the delay times in the MOS devices used in integrated circuits is desired. These delays are related to the on-state resistance as well as the junction capacitances of these MOS devices. In order to reduce these delays and increase MOS device speeds, improved source/drain regions as indicated are desired. Further, increasing device densities also result in a reduced source to drain distance, which requires that HDD dopant concentrations increase and move closer to the surface of the substrate. These changes may result in a disruption to the operation of a MOS transistor. In these and similar circumstances, certain aspects of the graded and the super-sharp HDD profile may help to avoid or mitigate some of the problems encountered, in the scaling of MOS devices.

What is needed to attain these higher switching speeds in a MOS transistor, is a higher drive current Ids, but at a lower body-to-source/drain junction capacitance Cjbw. Further, since the uppermost surface of the substrate (e.g., within 100 Å), is responsible for controlling the bulk of the drive current, it is desirable to minimize the subsurface areas available for leakage and lower body-to-source/drain junction capacitance Cjbw.

Various aspects of graded and super-sharp HDD implants have been used as an additional means to scale MOS transistor channel length, increase drive current, decrease Rds, minimize off-state leakage current and the like of high-speed, high-density MOS devices. Several conventional approaches to form transistor source/drain regions have been discussed such as the "Dual HDD process" approach, the "Disposable spacer process", the "HDD TIP process", the older "Dual Dopant process", and the conventional "Deep S/D implant" method. However, several difficulties encountered with each of these conventional approaches exist separately or in combination. Therefore, it is desirable to provide an improved method of forming a source/drain region to take advantage of several performance benefits of the graded and the super-sharp HDD profile in a MOS transistor, and in the manufacture of such semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to methods for forming a transistor source/drain region having a sharp HDD portion buried within a graded HDD portion in the manufacture of semiconductor devices. The invention provides for the formation and activation annealing of a graded HDD region and source/drain regions. A sharp HDD region is formed over the graded HDD region, followed by a flash anneal. The 2-D dopant concentration profiles produced in the S/D regions and the channel-to-source/drain region junctions, according to the inventive method, yield several benefits of both the graded and sharp HDD profiles.

To implement the formation of a source/drain region having a sharp HDD portion buried within a graded HDD portion of a MOS transistor, several aspects of the present invention are provided. One aspect of the invention provides a method which comprises providing a gate structure overlying a semiconductor substrate, implanting a first dopant material alongside the gate structure to form a first graded HDD layer in a source/drain region of the semiconductor device. A sidewall spacer is formed around the gate structure to guide an implanting of a second dopant material to form the source/drain regions.

A first thermal anneal activates the dopant atoms in the source/drain region and establishes the graded HDD portion profile along with the source/drain region (which is also graded). An offset spacer and the sidewall spacer are removed from the gate structure, for example, by a wet or dry etch and an optional cleaning process to expose a substrate region closer to the gate structure for a final implanting and formation of a sharp or (e.g., a super-sharp) HDD region. A second thermal anneal (e.g., laser or flash anneal) establishes the sharp HDD portion-of the source/drain region having a sharp HDD profile at the substrate surface (e.g., within 100 Å of the surface), and overlying the graded HDD portion of the transistor S/D region.

Thus, a transistor source/drain region is formed, according to one aspect of the invention, having a sharp HDD portion buried within a graded HDD portion, wherein several characteristic benefits of each portion may be achieved. The goal is to provide sharp HDD regions close to the surface, and graded HDD regions elsewhere subsurface. In so doing, the sharp HDD portion of the S/D provides a low channel and HDD resistance, and a low source-drain resistance Rds.

In addition, the graded HDD portion of the S/D significantly improves junction capacitance and leads to improved circuit performance. For example, graded HDD junctions may advantageously lower the body-to-source/drain junction capacitance Cjbw, lower the band-to-band tunneling current, and reduce channel dopant segregation into the HDD (S/D) region because most of the HDD region profile is not sharp and the electric field potential is reduced. Graded HDD junctions may also permit better trimming (compensation) of the HDD profile with super-sharp retrograde SSR channels, reduce punchthrough current (subsurface DIBL), and lower the pocket dosage requirement because the gross HDD dopant concentration in the channel is lower.

In a further aspect of the invention, a quad high-angle implant (pocket dose) may be performed on the device around and underlying the edge of the gate structure before the first graded HDD implant process. In another aspect of the invention, the first thermal annealing may be a conventional activation thermal anneal (e.g., about 1050° C. for about 1 second) used to activate the dopant atoms.

In another further aspect of the invention, an additional rapid thermal anneal (RTA) (e.g., about 950° C. for about 1 second) may be used to remove excess interstitial dopant atoms after the graded HDD implant process.

Again, in a further aspect of the invention, the graded HDD region extends from the surface of the semiconductor substrate down to a depth of about 300 Å, the source/drain region extends below the graded HDD region to a depth of about 1000 Å, and the sharp HDD region extends from the surface of the semiconductor substrate down to a depth of less than about 100 Å.

The improved formation method and dopant profiles achievable using the invention may be employed to provide formation of source/drain regions to take advantage of some of the potential performance benefits associated with both the sharp HDD portion and the graded HDD portion.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
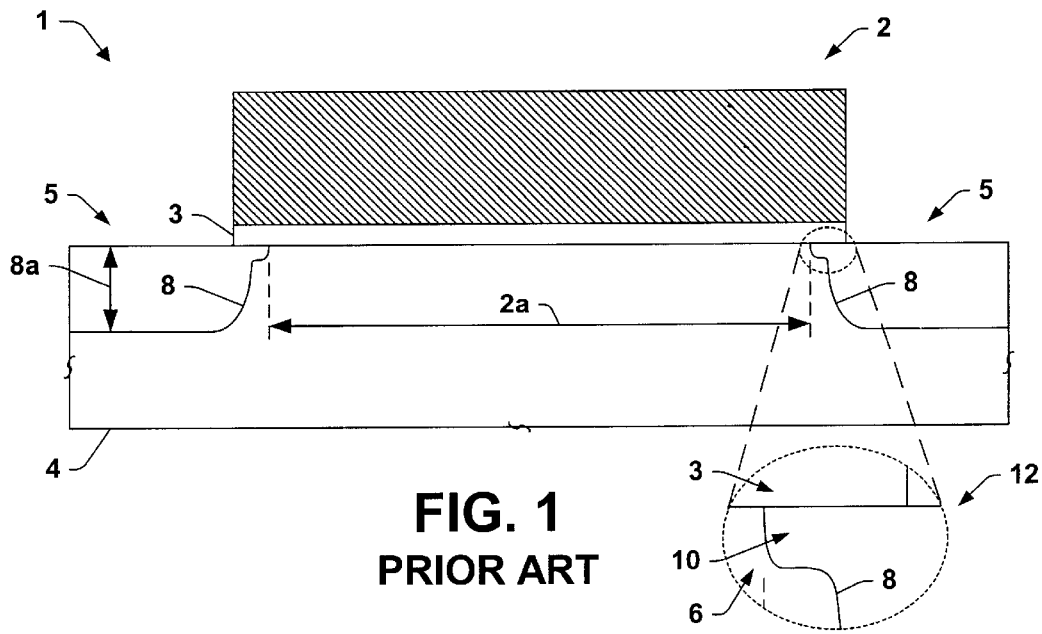
FIG. 1 is a partial cross-sectional side view of a prior art MOS transistor illustrating a source/drain profile and further detailing a drain extension or "tail" formed within a semiconductor substrate.
Figure 2:
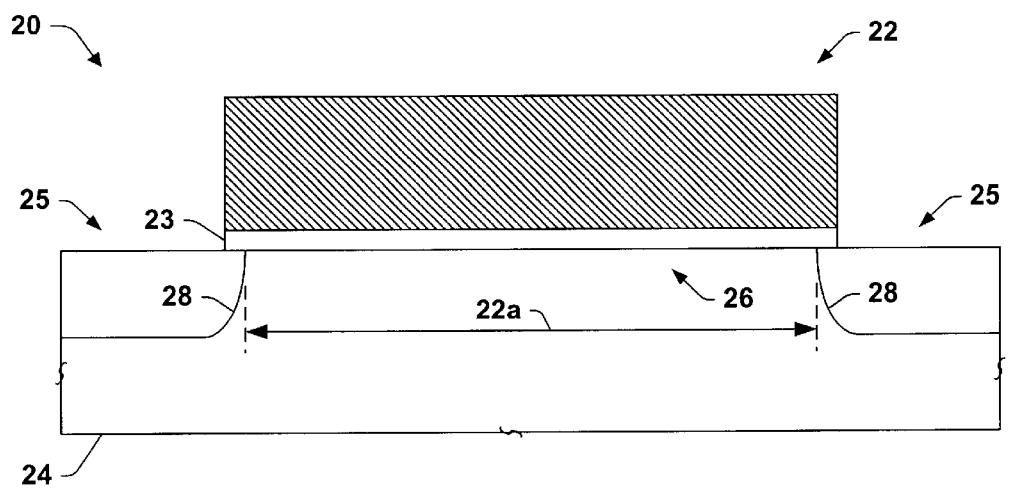
FIG. 2 is a partial cross-sectional side view of a prior art MOS transistor illustrating a source/drain profile formed within a semiconductor substrate without a drain extension or "tail"
Figure 3:
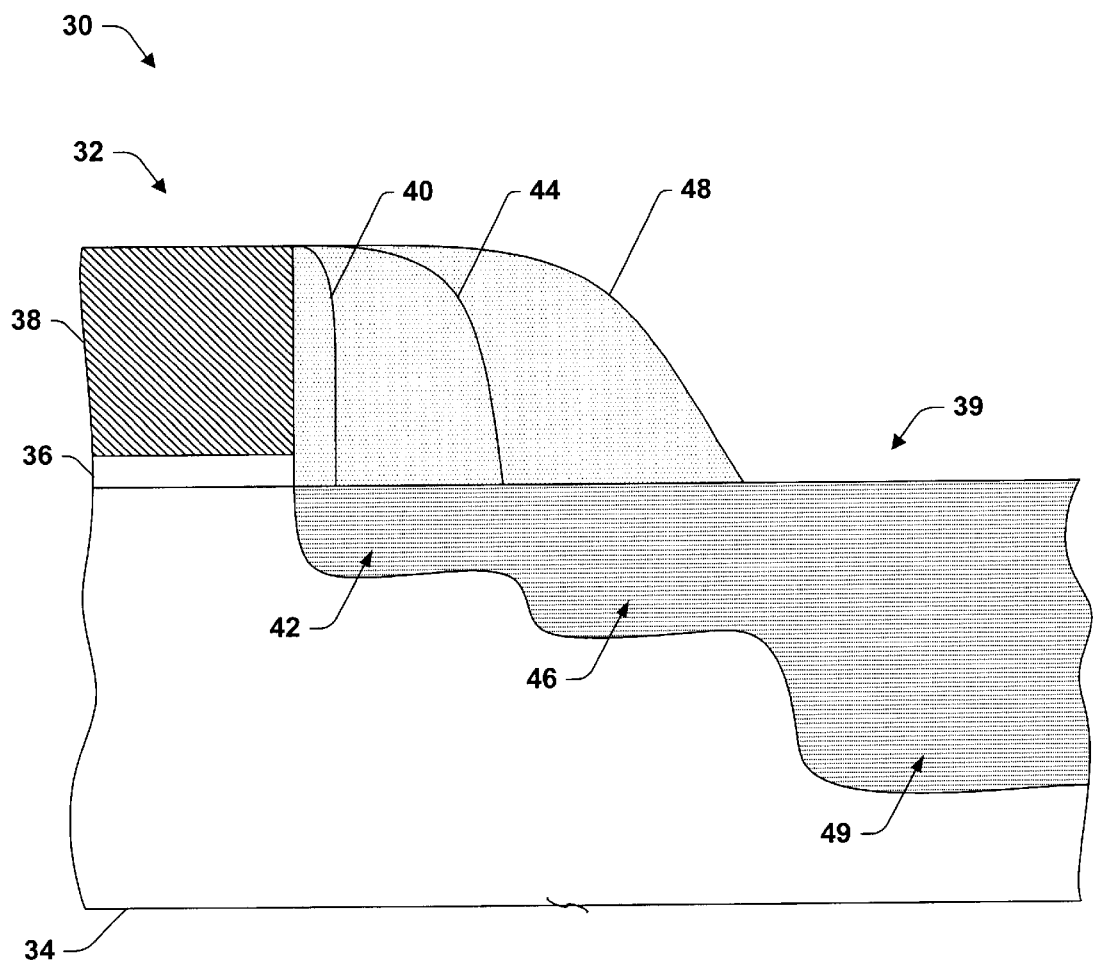
FIG. 3 is a partial cross-sectional side view of a MOS transistor illustrating a source/drain region formed according to a prior art "Dual HDD process", which creates two extension region steps in the source/drain profile.

The present invention will now be described with reference to the attached drawings, wherein like reference numerals are used to refer to like elements throughout. The invention relates to methods and techniques used in forming source/drain regions and shaping the dopant concentration profiles within a semiconductor substrate of a MOS transistor and other such semiconductor devices. One or more implementations of the invention are hereinafter illustrated and described in the context of formation of a sharp HDD portion embedded within a graded HDD portion of a source/drain region in a semiconductor substrate. However, it will be appreciated by those skilled in the art that the invention is not limited to the exemplary implementations illustrated and described hereinafter. In particular, the various aspects of the invention may be employed in association with the processing of other such substrate materials in devices using various dopants including boron, arsenic, or phosphorus, and various dopant concentrations including lightly doped drain LDD or highly doped drain HDD. In addition, various methods of applying the various dopants and concentrations are contemplated by the present invention.

One aspect of the invention provides methods for forming a sharp HDD portion embedded within a graded HDD portion of a source/drain region and for shaping the dopant concentration profiles within a silicon semiconductor substrate. A gate structure having an offset spacer is provided overlying a semiconductor substrate of the device. A graded HDD portion is formed in the substrate source/drain region by forming a graded HDD region and a source/drain region, followed by an activation annealing. The sharp HDD portion is then formed by a shallow, super-sharp HDD region over the graded HDD region, followed by a final thermal anneal (e.g., laser or flash anneal). The 2-D dopant concentration profiles produced in the S/D region and the channel-to-source/drain region junctions, according to the inventive method yield several benefits of both the graded and sharp HDD profiles.

For example, one aspect of the invention provides a process whereby the transistor drive current may be optimized by lowering the channel and S/D region, and Rds with the sharp HDD portion, and whereby the tunneling current and channel dopant loss may be minimized while lowering the junction capacitance with the graded HDD portion. These and other benefits will become more apparent as the following figures are described.

Figure 4A:
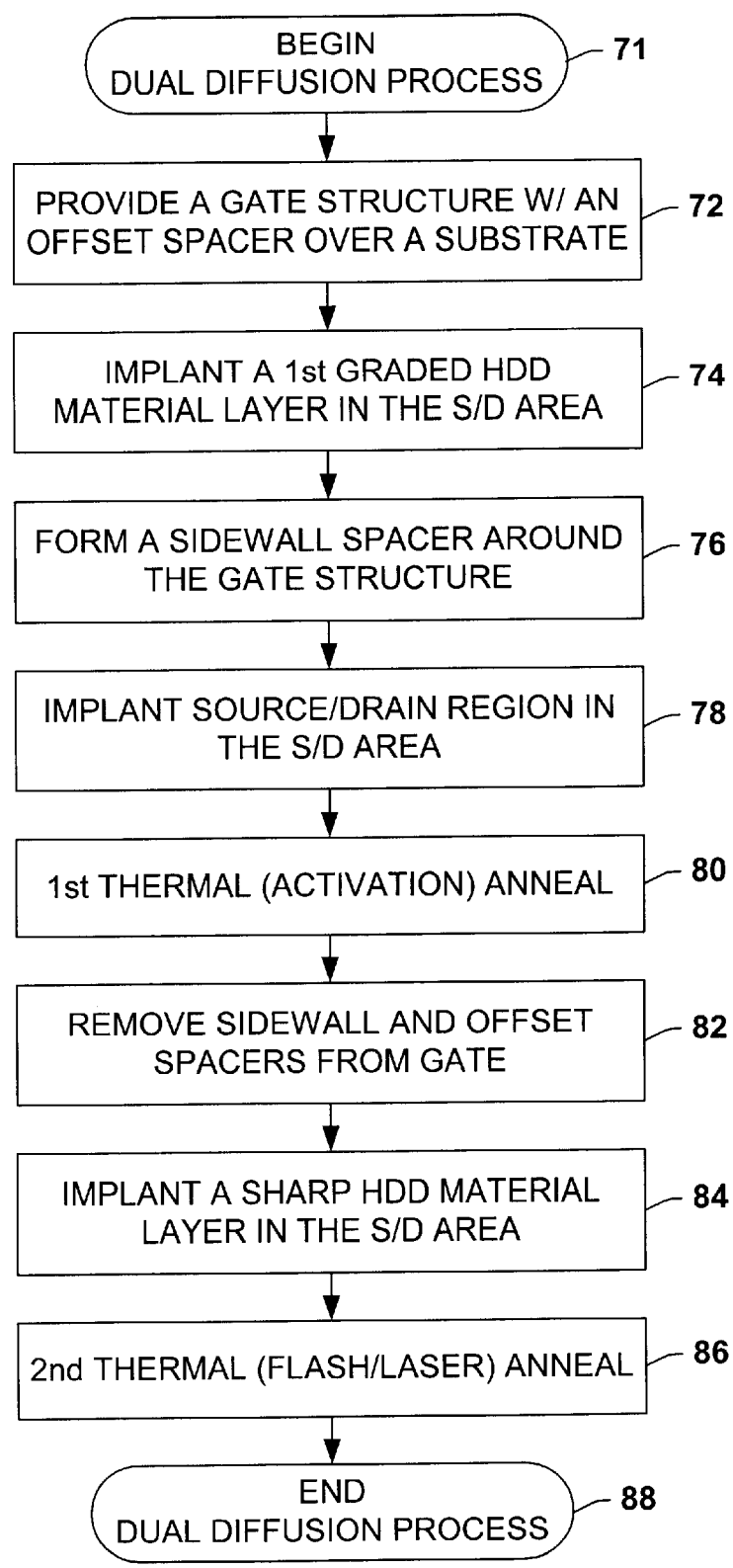
FIG. 4A is a flow diagram illustrating an exemplary method of forming a source/drain region in a semiconductor device in accordance with the present invention.

FIG. 4A illustrates one exemplary method 70 for forming a source/drain region in a semiconductor device in accordance with the present invention.

While the method 70 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 70 comprises forming a source/drain region within a silicon semiconductor substrate and alongside a gate structure in a MOS transistor of a semiconductor device. Beginning at 71, the method 70 comprises providing a gate structure having an offset spacer, which has been formed over the semiconductor substrate at 72 of the semiconductor device. In one example, an upper oxynitride layer may be provided over a polysilicon layer of the gate structure, which serves as a hard mask for patterning the poly gate and later removal (e.g., etching) of the offset spacer and a sidewall spacer from the gate structure. A polysilicon material layer is typically formed over a gate-oxide layer, and an offset spacer comprising a dielectric material such as oxide is formed surrounding the gate-oxide material layer, the polysilicon material layer, and the oxynitride hard mask layer.

At 74, a first dopant material is implanted in the source/drain area of the semiconductor substrate alongside the gate structure to form a graded HDD region. In one example, the graded implant at 74 places a p-type dopant concentration of about 1.5E20 atoms/cm$^3$ for a PMOS transistor, or an n-type dopant concentration of about 8–9E20 atoms/cm$^3$ for an NMOS transistor, to a depth of about 300–350 Å (note, however, that the concentration is graded and decreases with increasing depth). Other implant concentrations, depths, and types of semiconductor devices are possible within the scope of the invention.

At 76, a sidewall spacer is formed on lateral sidewalls of the gate structure, and in one example comprises an oxide-nitride-oxide layer sidewall spacer with a width of about 500–700 Å. Other sidewall spacer widths and material compositions are possible within the scope of the invention.

The sidewall spacer guides the boundary of the source/drain regions implanted at 78 into the S/D area. In one example, the source/drain implant at 78 develops a dopant concentration gradient of about 1–1.5E20 atoms/cm$^3$/6 nm (or a little more than 6 nm/decade of dopant concentration), to a depth of about 1000 Å. Other implant concentrations, depths, and types of semiconductor devices are possible within the scope of the invention.

At 80, a first thermal anneal (activation anneal) is performed. In one example, the first thermal anneal at 80 is performed at about 1050° C. for about 1 second. Thus, a graded HDD region together with the source/drain region is formed.

The inventor has found that by making the graded HDD portion as graded as possible, the amount of channel dopant segregation therein is minimized, resulting in minimized dopant loss and reduced dose compensation, and beneficially lowers the tunneling current. The inventor has further appreciated that to minimize the subsurface areas available for leakage and lower body-to-source/drain junction capacitance Cjbw, the graded HDD portion into the substrate is advantageous.

The inventor also realized that by applying a first anneal after implanting the graded HDD region and source/drain region, and a second anneal after implanting the sharp HDD portion permits dopant activation while retaining the desired dopant gradient profile throughout the substrate depth.

At 82, the sidewall and offset spacers are removed from the lateral sidewalls of the gate structure, thereby exposing at least a portion of the substrate in the source/drain region and alongside the gate structure. A hard mask formed overlying the gate structure protects the gate structure during the spacer removal process which, for example, may be removed by a wet or dry etch.

At 84, a third dopant material is implanted in the source/drain region of the semiconductor substrate alongside the gate structure to form a sharp HDD region. In one example, the sharp HDD implant at 84 places a p-type dopant concentration of about 3–4E20 atoms/cm$^3$ for a PMOS transistor and about 1–2E21 atoms/cm$^3$ for an NMOS transistor, to a depth of about 50–100 Å. Other implant concentrations, depths, and types of semiconductor devices are possible within the scope of the invention.

Thereafter at 86, a second thermal anneal (e.g., a flash or LASER anneal) is performed. In one example, the second thermal anneal at 86 is performed at about 1100–1200° C. for about 1 ms to limit the depth of the thermal effects to the sharp HDD region. Thus, the sharp HDD implant forms a shallow, sharp HDD region (having a sharp dopant concentration gradient) of the source/drain region, wherein the sharp HDD portion is embedded within the graded HDD portion of the S/D region of the MOS transistor.

The inventor has further appreciated that by making the sharp HDD portion of the S/D region as thin (shallow) and sharp (with respect to the dopant gradient) as possible the channel resistance, and the HDD resistance is decreased, and the source/drain on-state resistance Rds is also reduced. In addition, by keeping the sharp HDD region at the surface of the substrate as thin or shallow as possible, an HDD tail under the edge of the gate structure into the channel region is minimized, permitting a longer channel width and a lower off-state current (Ioff).

Finally the source/drain formation method 70 ends at 88, and subsequent conventional back-end processing may be provided.

Figure 4B:
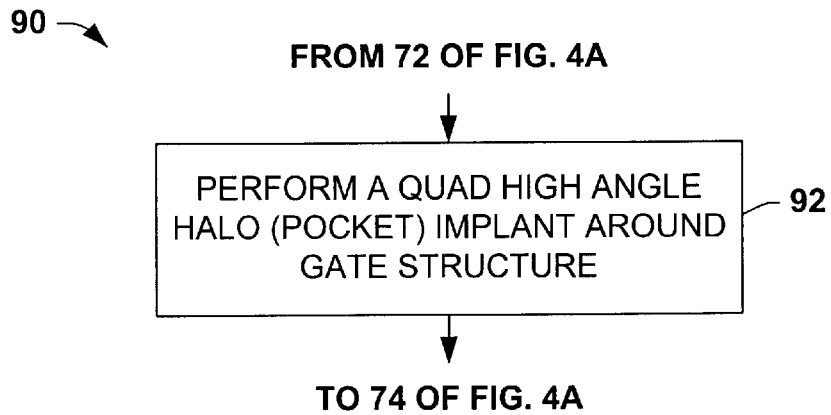
FIG. 4B is a flow diagram further illustrating an optional quad high angle pocket implant in the method of FIG. 4A.

Optionally, FIG. 4B illustrates a further exemplary quad high-angle implant 90 which may be accomplished after providing the gate structure (e.g., at 72 of method 70 of FIG. 4A above). At 92 of FIG. 4B, a quad high-angle implant 90 places the halo (pocket) dose around the edge of the gate structure in a source/drain region of the semiconductor substrate and underlying a portion of the gate structure. In one example, the high-angle implant places at 92 a p-type halo dopant concentration of about 1.5–2E19 atoms/cm$^3$ at the center of the halos for an NMOS transistor. Other implant concentrations and types of semiconductor devices including PMOS transistors are possible within the scope of the invention. Thereafter, the implant 90 of FIG. 4B ends and continues back to 74 of the method 70 of FIG. 4A.

Figure 4C:
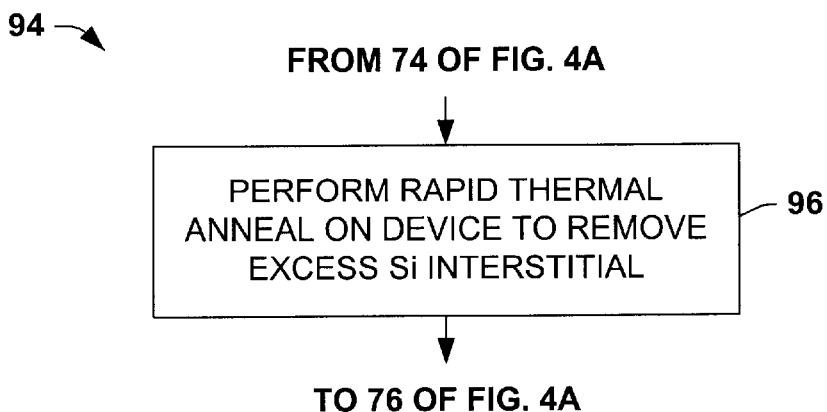
FIG. 4C is a flow diagram further illustrating an optional rapid thermal anneal in the method of FIG. 4A.

Optionally, FIG. 4C illustrates a further exemplary thermal annealing process 94 which may be accomplished after implanting the first graded HDD region (e.g., at 74 of method 70 of FIG. 4A above). At 96 of FIG. 4C, the exemplary thermal annealing process is illustrated, comprising a rapid thermal anneal (RTA). In one example, the RTA may be performed at about 950° C. for about 1 second to remove excess interstitial silicon atoms before forming the sidewall spacer (e.g., 76 of FIG. 4A). In one example, the determination whether to perform the optional RTA may be made, based on the sidewall spacer deposition temperature and time used. For example, if the sidewall spacer deposition temperature is high (e.g., >600° C.) and the deposition time is long (e.g., >0.1 min), then the sidewall spacer process may cause the dopant to exhibit transient enhanced diffusion. In this case, the determination may be made that the RTA anneal is needed after the graded HDD implant. However, if the sidewall spacer deposition time and temperature are less than those stated, the optional RTA anneal process may be eliminated. Otherwise, the RTA process 94 ends and continues back to 76 of the method 70 of FIG. 4A.

Figure 4D:
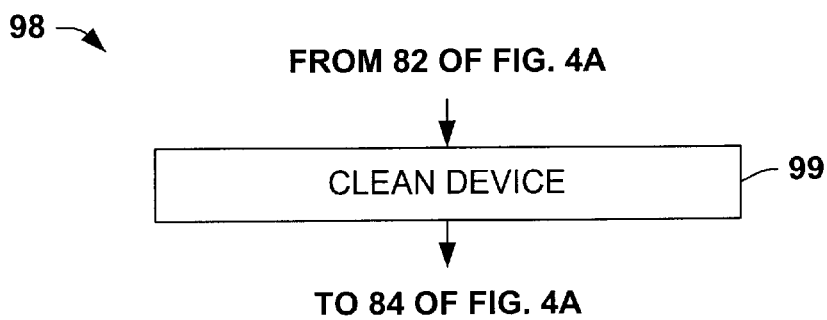
FIG. 4D is a flow diagram further illustrating an optional clean in the method of FIG. 4A.

Optionally, FIG. 4D illustrates a further exemplary cleaning process 98 which may be accomplished after removal of the offset and sidewall spacers (e.g., at 82 of method 70 of FIG. 4A above). At 99 of FIG. 4D, the exemplary cleaning process is illustrated, comprising, for example, a deionized water rinse, a solvent rinse, or a plasma etch to remove any residual debris from the spacer removal process/etch. Thereafter, the cleaning process 98 ends and continues back to 84 of the method 70 of FIG. 4A.

Thus, the improved formation method, in accordance with the invention, may be employed to provide the formation of a sharp HDD portion embedded within a graded HDD portion of a source/drain region to take advantage of some of the potential performance benefits of both the graded and sharp HDD profiles in a MOS transistor and such semiconductor devices.

FIGS. 5A–5M illustrate one such implementation, wherein a source/drain region having a sharp HDD portion embedded within a graded HDD portion is formed in a semiconductor substrate of a MOS transistor in a semiconductor device. The illustrated portions of the exemplary formation process involve the use of an oxynitride hard mask, polysilicon and gate oxide layers, as well as oxide materials in offset and sidewall spacers for use in forming a source/drain region. However, it is noted at-this point that the invention is not limited to such specific applications, and further that the structures illustrated and described hereinafter are not necessarily drawn to scale.

Figure 5A:
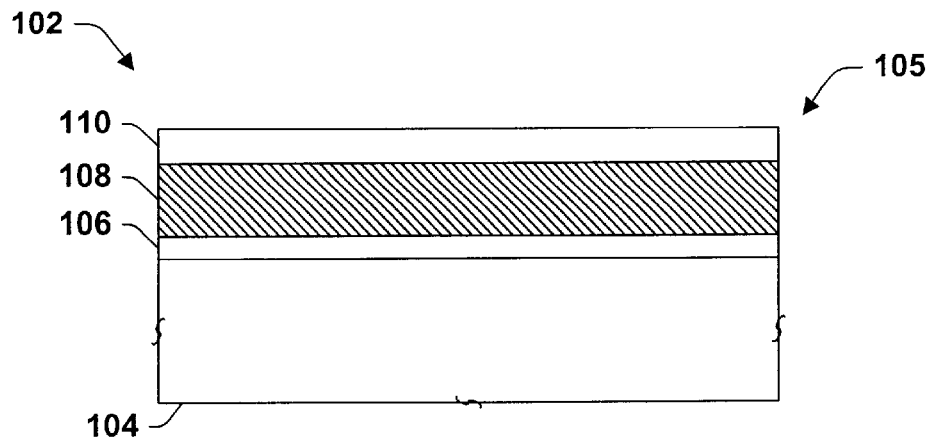
FIG. 5A–5F are partial cross-sectional side views illustrating various steps of forming a gate structure having an offset spacer thereon which are formed overlying a semiconductor substrate of a semiconductor device in accordance with an exemplary aspect of the present invention.

In FIG. 5A, an exemplary MOS transistor 102 is illustrated at an intermediate stage of fabrication processing of a semiconductor device, wherein the MOS transistor 102 has been formed on or in a semiconductor substrate 104, such as silicon or silicon-germanium.

Initially in FIG. 5A, the MOS transistor 102 comprises multiple layers of material which comprise a gate stack 105, which is formed over the semiconductor substrate 104. The exemplary layers of the gate stack 105 comprise a gate-oxide material layer 106 formed over the semiconductor substrate 104, a polysilicon material layer 108 formed over the gate-oxide layer 106, and a hardmask layer 110 comprising for example, an oxynitride material formed overlying the polysilicon material layer 108 and the gate-oxide material layer 106.

Figure 5B:
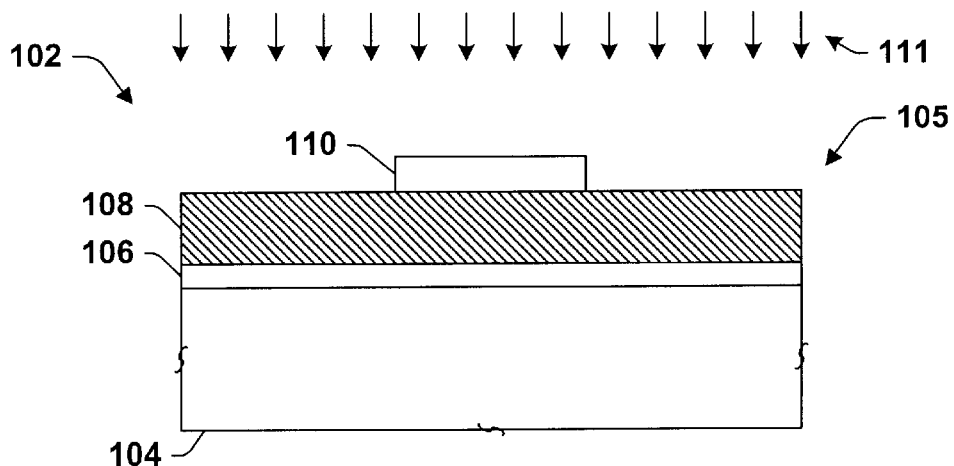

In FIG. 5B, the hard mask layer 110 is patterned using a photoresist and an anisotropic etch 111 into the gate stack 105.

Figure 5C:
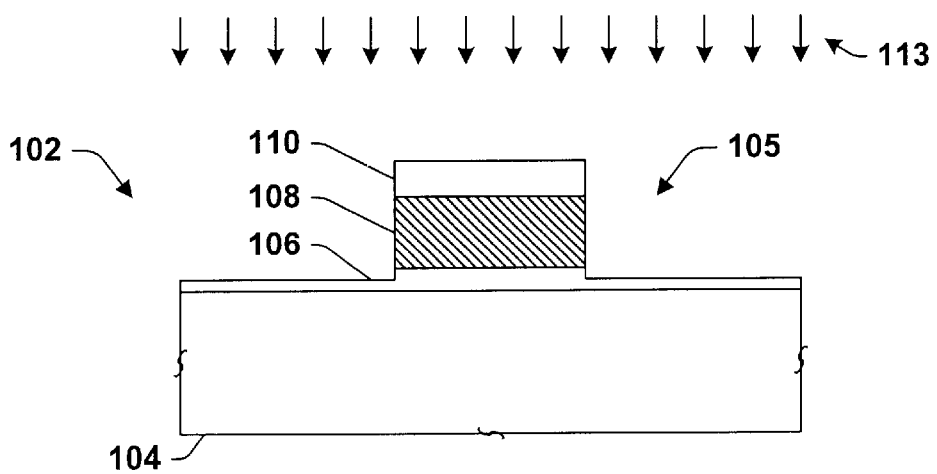

In FIG. 5C, the hard mask layer 110 now serves as a pattern for further formation of the gate stack 105 by performing an etch 113 through the polysilicon material layer 108 and partially into the gate-oxide layer 106 because of the silicon selectivity of the etch 113.

Figure 5D:
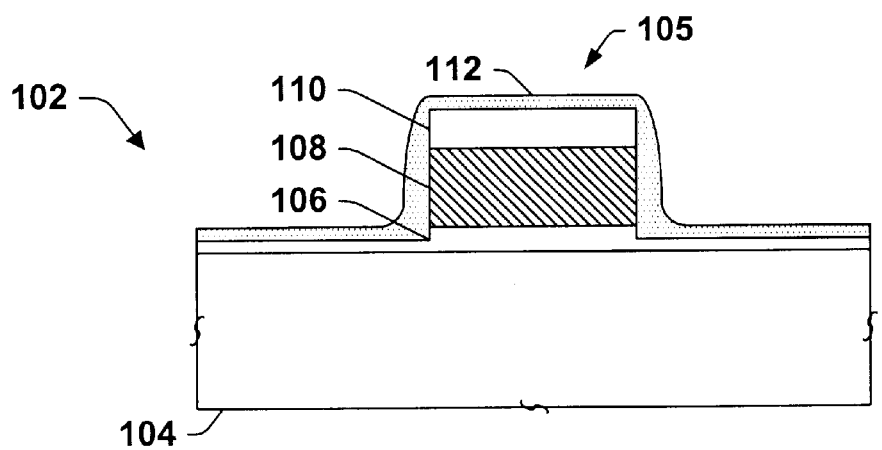
Figure 5E:
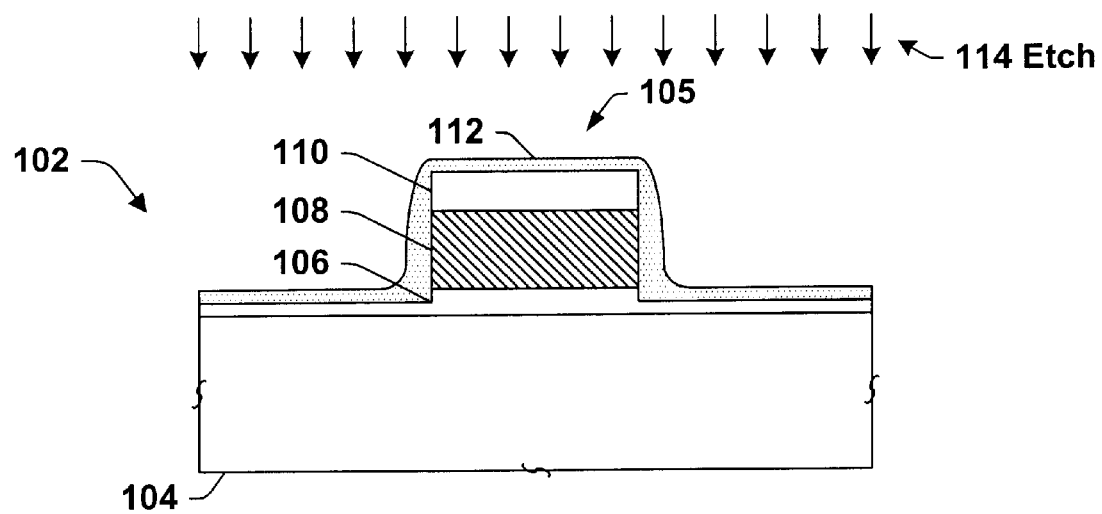
Figure 5F:
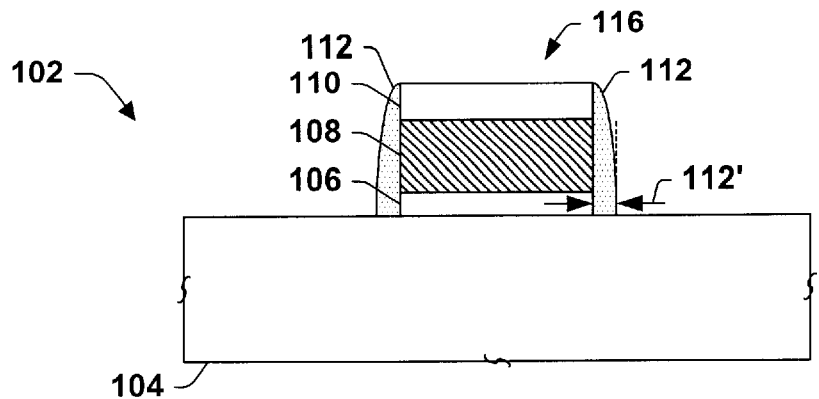

In FIG. 5D, an offset spacer 112 comprising an oxide material, is formed overlying the gate stack 105 and the remaining gate-oxide layer 106 overlying the semiconductor substrate 104. In FIG. 5E, performing an anisotropic etch 114 removes portions of the oxide material of the offset spacer 112 to expose the hard mask layer 110 and the semiconductor substrate 104, respectively. FIG. 5F illustrates the final shape of the offset spacer 112, and that of a gate structure 116 formed overlying the semiconductor substrate 104, resulting from the anisotropic etch 114 of FIG. 5E. FIG. 5F also shows that the offset spacer 112 is formed to a thickness 112'.

Figure 5G:
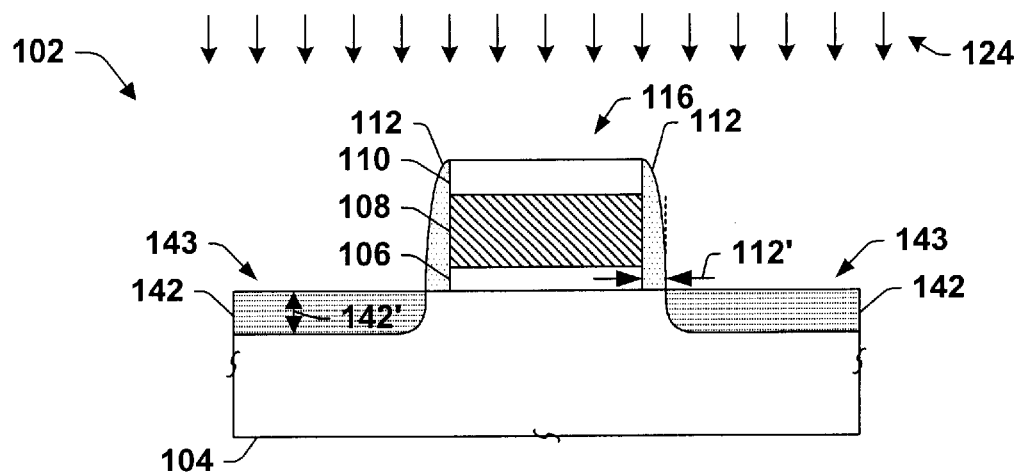
FIG. 5G is a partial cross-sectional side view illustrating formation of a graded HDD region in the substrate source/drain area of the device of FIG. 5F.

In FIG. 5G, a first implant 124 is performed on the semiconductor substrate 104 alongside the gate structure 116 of the MOS transistor 102. In accordance with an aspect of the invention, a first dopant material (e.g., a high concentration dopant, HDD-type dopant) is used to form a graded HDD region 142 to a depth 142' in the source/drain area 143 of the substrate 104. The first implant 124 in combination with a subsequent anneal, results in the formation of a graded HDD dopant distribution in the source/drain area 143 of the substrate 104. In one example, the first implant 124 places a p-type dopant concentration of about 1.5E20 atoms/cm$^3$ for a PMOS transistor, or an n-type dopant concentration of about 8–9E20 atoms/cm$^3$ for an NMOS transistor, to a depth 142' of about 300–350 Å. Other implant concentrations, depths, gradients, and types of semiconductor devices are also anticipated within the scope of the present invention. The offset spacer 112 guides the implant 124 to space the implant away from the gate stack 105 by the thickness 112'.

Figure 5H:
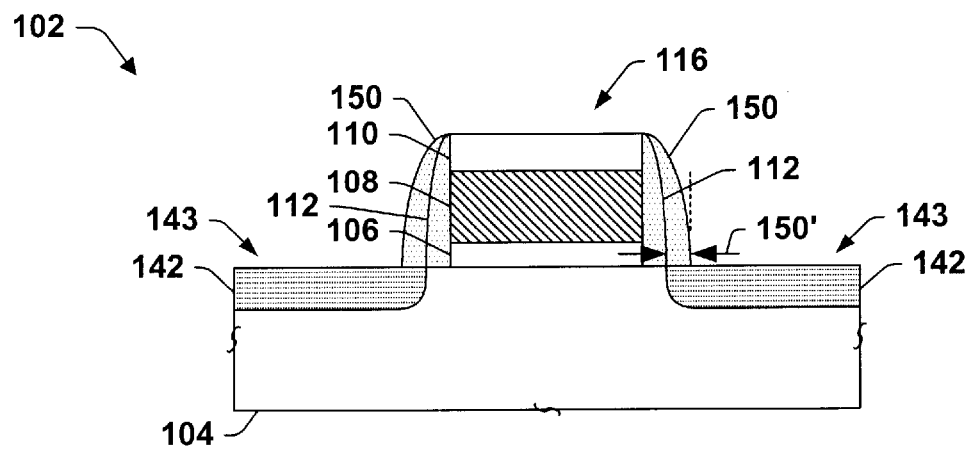
FIG. 5H is a partial cross-sectional side view illustrating formation of a sidewall spacer over gate structure of the device of FIG. 5G.

In FIG. 5H, a sidewall spacer 150 comprising an oxide material, is formed on lateral sidewalls of the gate structure 116 to a thickness 150' and overlying the semiconductor substrate 104. In one example, the sidewall spacer 150 comprises an oxide-nitride-oxide sidewall spacer with an overall width 150' of about 500–700 Å. Other sidewall spacer widths and material compositions are also anticipated within the scope of the present invention.

Figure 5I:
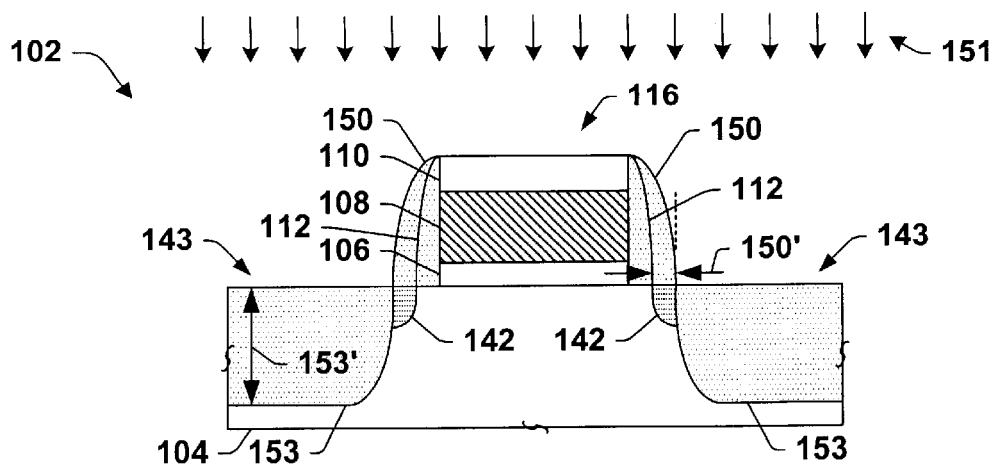
FIG. 5I is a partial cross-sectional side view illustrating formation of source/drain regions in the substrate of the device of FIG. 5H.

In FIG. 5I, a second implant (a source/drain implant) 151 is performed in the source/drain area 143 of the substrate 104. In accordance with an aspect of the invention, a second dopant material (e.g., same type as the first dopant) is used to form a source/drain region 153 to a depth 153' in the source/drain region 143 of the substrate 104. In one example, the second implant 151 develops a graded dopant concentration gradient of about 1–1.5E1 atoms/cm$^3$/6 nm (or a little more than 6 nm/decade of dopant concentration), to a depth 153' of about 1000 Å. Other implant concentrations, depths, gradients, and types of semiconductor devices are also anticipated within the scope of the present invention.

Although FIG. 5I and subsequent figures illustrate the source/drains 153 visually replacing lateral portions of the first graded HDD material layer 142, it will be appreciated by those skilled in the art, that these and other such implanted dopant layers may be better understood as "overlays" of implanted layers, or as forming vertically blended dopant profiles such as will be discussed later in association with FIG. 7.

Figure 5J:
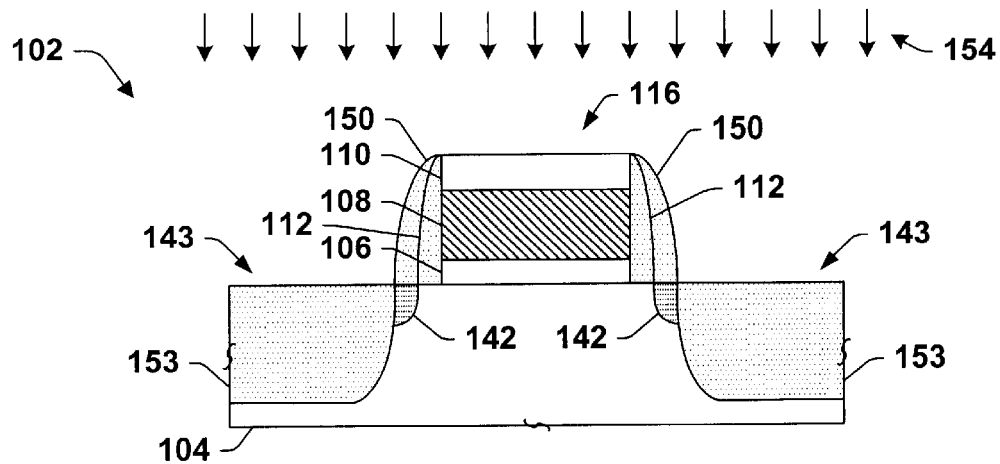
FIG. 5J is a partial cross-sectional side view illustrating a first thermal anneal to activate the device of FIG. 5I.

In FIG. 5J, a first thermal anneal 154 is performed. In one example, the first thermal anneal is an activation anneal performed at about 1050° C. for about 1 second. Together, formed and annealed in this way, the first and second regions (142 and 153 respectively) form a graded HDD region 142 and the source/drain regions 153 (which are also graded). With the lower areas of the HDD region 142 graded in this way, source/drain leakage current paths associated therewith may be minimized.

Figure 5K:
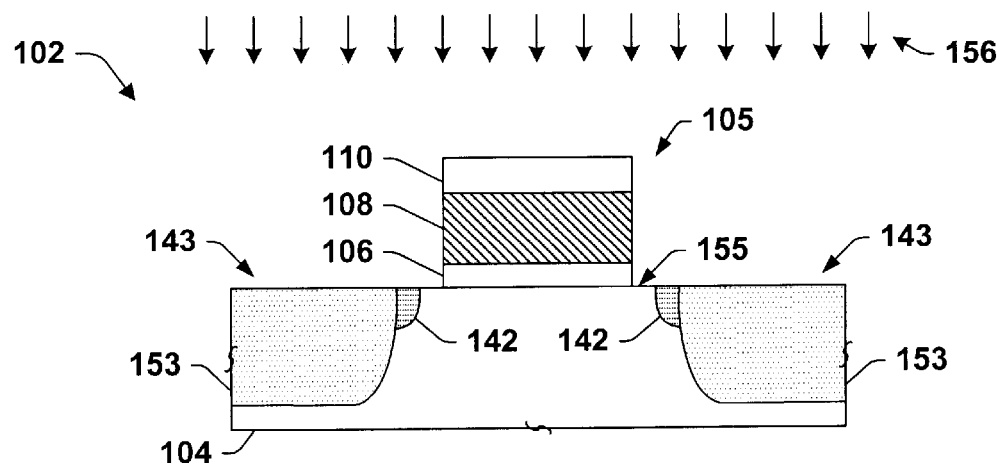
FIG. 5K is a partial cross-sectional side view illustrating removal of the sidewall and offset spacers from the gate structure of the device of FIG. 5J.

In FIG. 5K, the sidewall spacer 150 and the offset spacer 112 are removed from the lateral sidewalls of the gate structure 116; thereby exposing at least a portion 155 of the substrate 104 alongside the gate stack 105 in the source/drain area 143. The hard mask layer 110 atop the gate stack 105 protects the underlying structures during an anisotropic etch 156 (e.g., a wet or dry etch) to remove the spacers.

Figure 5L:
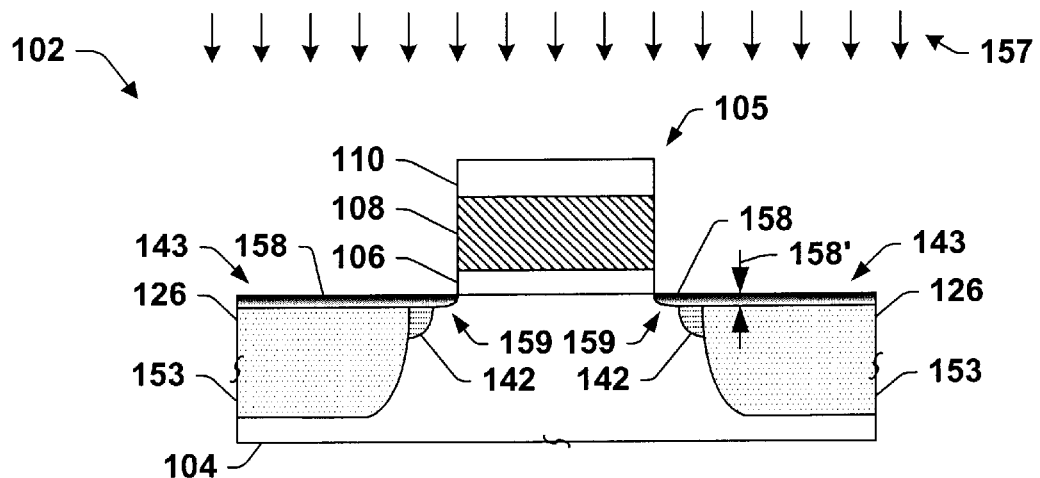
FIG. 5L is a partial cross-sectional side view illustrating formation of a sharp HDD region in the substrate surface of the source/drain region of the device of FIG. 5K.

In FIG. 5L, a third implant 157 is performed in the source/drain area 143 of the substrate 104. In accordance with an aspect of the invention, a third dopant material (e.g., a high concentration dopant, HDD-type dopant which is the same type as the source/drain dopant) may be used to form a sharp HDD region 158 to a depth 158' in the source/drain area 143 of the substrate 104. In one example, the third implant 157 develops a sharp dopant concentration gradient in the sharp HDD region 158 by placing a p-type dopant concentration of about 3–4E20 atoms/cm$^3$ for a PMOS transistor, or 1–2E21 atoms/cm$^3$ for an NMOS transistor, to a depth 158' of about 50–100 Å. Other implant concentrations, depths, gradients, and types of semiconductor devices are also anticipated within the scope of the present invention.

Figure 5M:
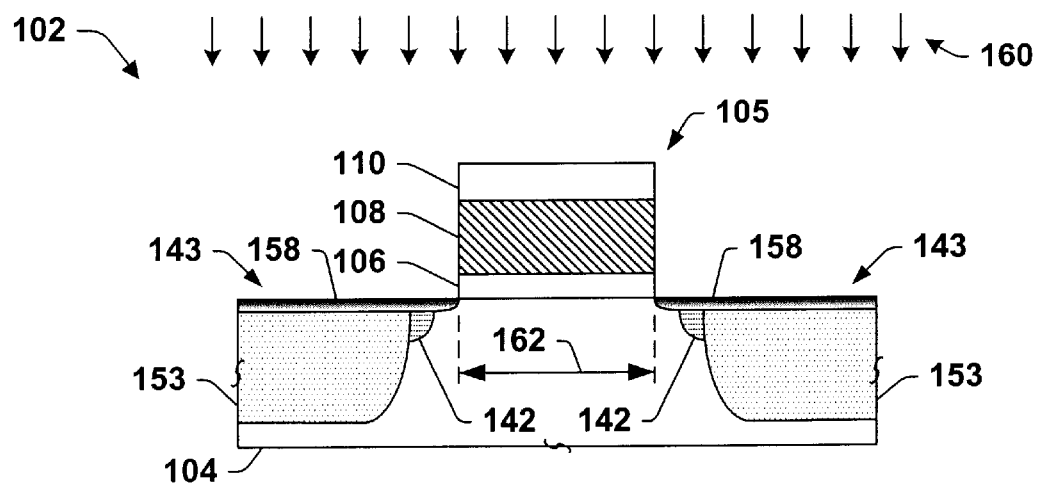
FIG. 5M is a partial cross-sectional side view illustrating a second thermal anneal of the device of FIG. 5L.

In FIG. 5M, a second thermal anneal 160 is performed. In one example, the second thermal anneal is a flash or LASER anneal performed at about 1100–1200° C. for about 1 ms to generally limit the depth of the thermal anneal to the sharp HDD layer 158 and limit an amount of diffusion thereof. Thus, the sharp HDD region 158 forms a shallow, sharp dopant concentration gradient HDD portion 158 in the source/drain area 143, wherein the sharp HDD portion 158 is embedded within the graded HDD portion 142 of the MOS transistor 102.

As has been discussed, the inventor has appreciated that by making the sharp HDD portion 158 of the S/D area 143 as shallow and sharp in concentration gradient as possible, the channel resistance, the HDD resistance, and the source/drain on-state resistance Rds is minimized due to less needed dopant compensation. In addition, the inventor has discovered that by keeping the sharp HDD material layer 158 at the surface of the substrate 104 as thin or shallow as possible, an HDD tail under the edge of the gate structure 116 into the channel region will be minimized, providing a longer channel width 162. The inventor has further discovered that the longer channel width 162 permits a higher saturation drive current (Idsat) and linear drive current (Idlin) relative to (normalized to) the off-state current (Ioff_s) and the gate-drain capacitance (Cgd).

Further, the inventor has found that graded areas of the source/drain region 143 advantageously reduce body-to-source/drain junction capacitance Cjbw and leakage effects to underlying substrate areas. Further, a graded dopant distribution beneficially lowers the tunneling current and the source/drain on-state resistance Rds due to less compensation that is later required to an HDD dose.

Figure 6A:
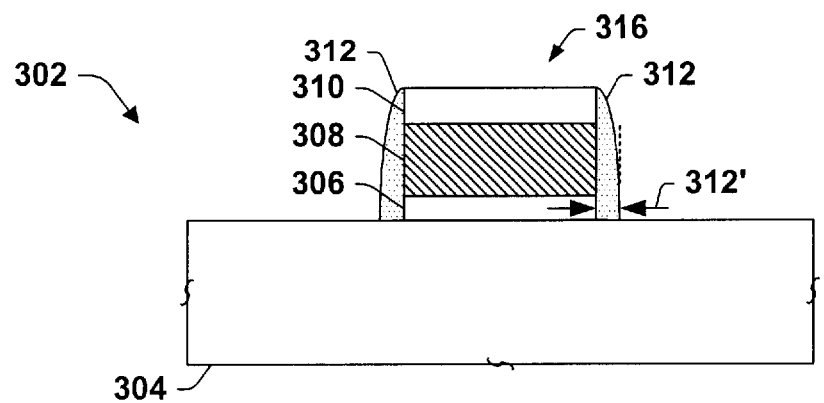
FIG. 6A is a partial cross-sectional side view illustrating another exemplary semiconductor device, having been processed similar to the device of FIGS. 5A–5G, wherein a gate structure and an offset spacer has been formed thereon and overlying a semiconductor substrate of the semiconductor device in a source/drain region in accordance with another aspect of the invention.
Figure 6B:
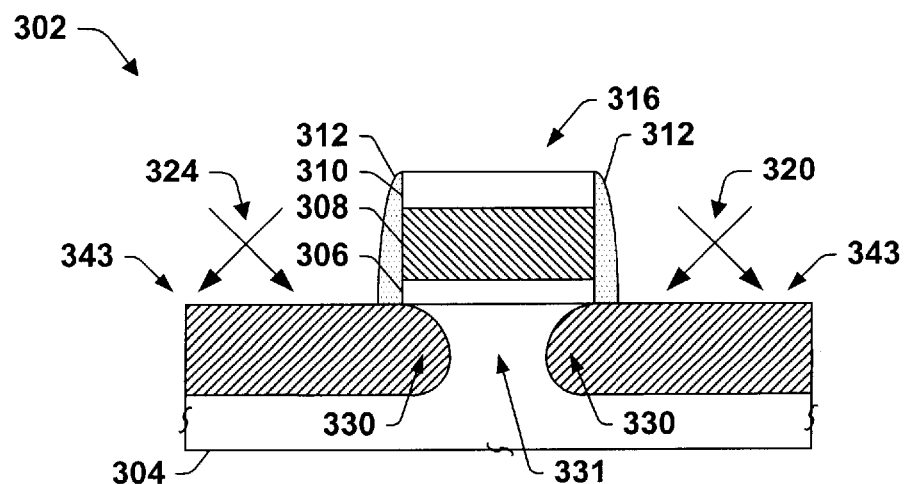
FIG. 6B is a partial cross-sectional side view illustrating a quad high angle pocket implant of the device of FIG. 6A.
Figure 6C:
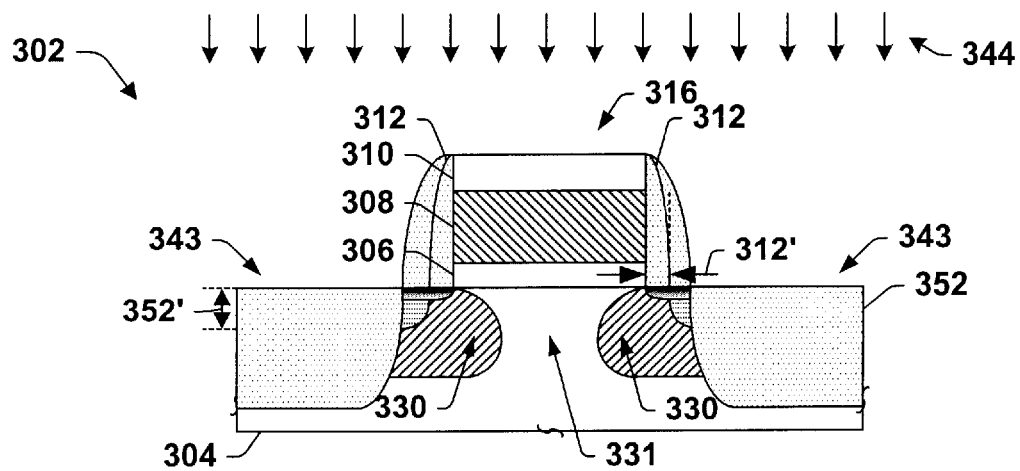
FIG. 6C is a partial cross-sectional side view illustrating formation of-a first graded HDD material layer in the substrate source/drain region of the device of FIG. 6B.

FIGS. 6A–6C illustrate another such implementation, wherein a HDD MOS transistor is formed with a quad high-angle halo implant. The illustrated portions of the formation process involve the use of an oxynitride hard mask, polysilicon and gate oxide layers, as well as oxide materials in offset and sidewall spacers, and the use of a quad high-angle implant process to form a halo or pocket region in the channel. However, it is noted at this point that the invention is not limited to such specific applications, and further that the structures illustrated and described hereinafter are not necessarily drawn to scale.

Preceding FIG. 6A, the method 70 of FIG. 4A and the pocket implant option method 90 of FIG. 4B, and processes exemplified by FIGS. 5A–5F of MOS device 102 are similar to that of MOS device 302, and as such need not be fully described again for the sake of brevity, except where noted. In FIG. 6A, a MOS transistor 302 is illustrated at an intermediate stage of fabrication processing of a semiconductor device, wherein the MOS transistor 302 has been formed on or in a semiconductor substrate 304, such as silicon or silicon-germanium.

Again in FIG. 6A, the MOS transistor 302 comprises a gate structure 316, which has been provided formed over the semiconductor substrate 304. Gate structure 316 comprises a gate-oxide material layer 306 formed over the semiconductor substrate 304, a polysilicon material layer 308 formed over the gate-oxide layer 306, and a hard mask layer 310 comprising an oxynitride material formed overlying the polysilicon material layer 308 and the gate-oxide material layer 306. An offset spacer 312 with a thickness 312' has been formed around the gate layers and over a portion of the semiconductor substrate 304.

FIG. 6B, illustrates a high-angle halo implant 320 performed into the semiconductor substrate 304, guided or limited by the offset spacer 312 to produce a dopant concentration area forming a halo 330 underlying the gate structure 316.

Because the halo implant 320 is performed at a high-angle, and "shadows" under the offset spacer 312 of the gate structure 316, the dopant concentration is formed having a vertically retrograde profile extending toward the substrate surface relative to the mid-depth of the halo 330 at a center 331 of the channel. In addition, because the combination of the high-angle and the exposure timing of the halo implant 320, a distance between both portions of the halo 330 is maintained and a laterally graded profile toward the center 331 of the channel is provided for maintaining and controlling the Vt roll-off of the device. Thus the halo 330 is formed in a source/drain area 343 of the semiconductor substrate 304 of the MOS transistor 302.

Thereafter, in FIG. 6C, the method and process as exemplified by FIGS. 5G–5M of MOS device 102 continues similarly to that of MOS device 302, and as such need not be fully-described again for the sake of brevity. Thus, in accordance with an aspect of the invention, a first dopant material may be used in a first implant 344 to form a graded HDD material layer 352 to a depth 352' in the source/drain region 343 of the substrate 304 and overlying a portion of the halo 330. The first implant 344 in combination with a source/drain implant and a subsequent anneal provides a graded dopant distribution within the graded HDD region 352 which is embedded within a halo 330 formed in the source/drain area 343 of the substrate 304. A shallow, sharp HDD region 358 is then formed after removal of the spacers followed by a-flash or laser anneal as described supra.

Further, the retrograde profile associated with the lower channel portion extends under the source/drain regions to minimize the body-to-source/drain junction capacitance (Cjbw), to minimize tunneling current, and to minimize the source-drain resistance Rsd. The Rsd-would be minimized because less compensation of the dose to the highly doped source/drain areas would be required. A low Rsd allows less potential (voltage) drop across the highly doped source/drain region, thus more potential will drop across the channel. It is the amount of potential drop across the channel that determines the amount of drive current. Since the uppermost surface of the substrate (e.g., within about 100 Å), is responsible for controlling the bulk of the drive current, several aspects of the invention seek to minimize the subsurface areas available for leakage and lower body-to-source/drain junction capacitance Cjbw.

Figure 7:
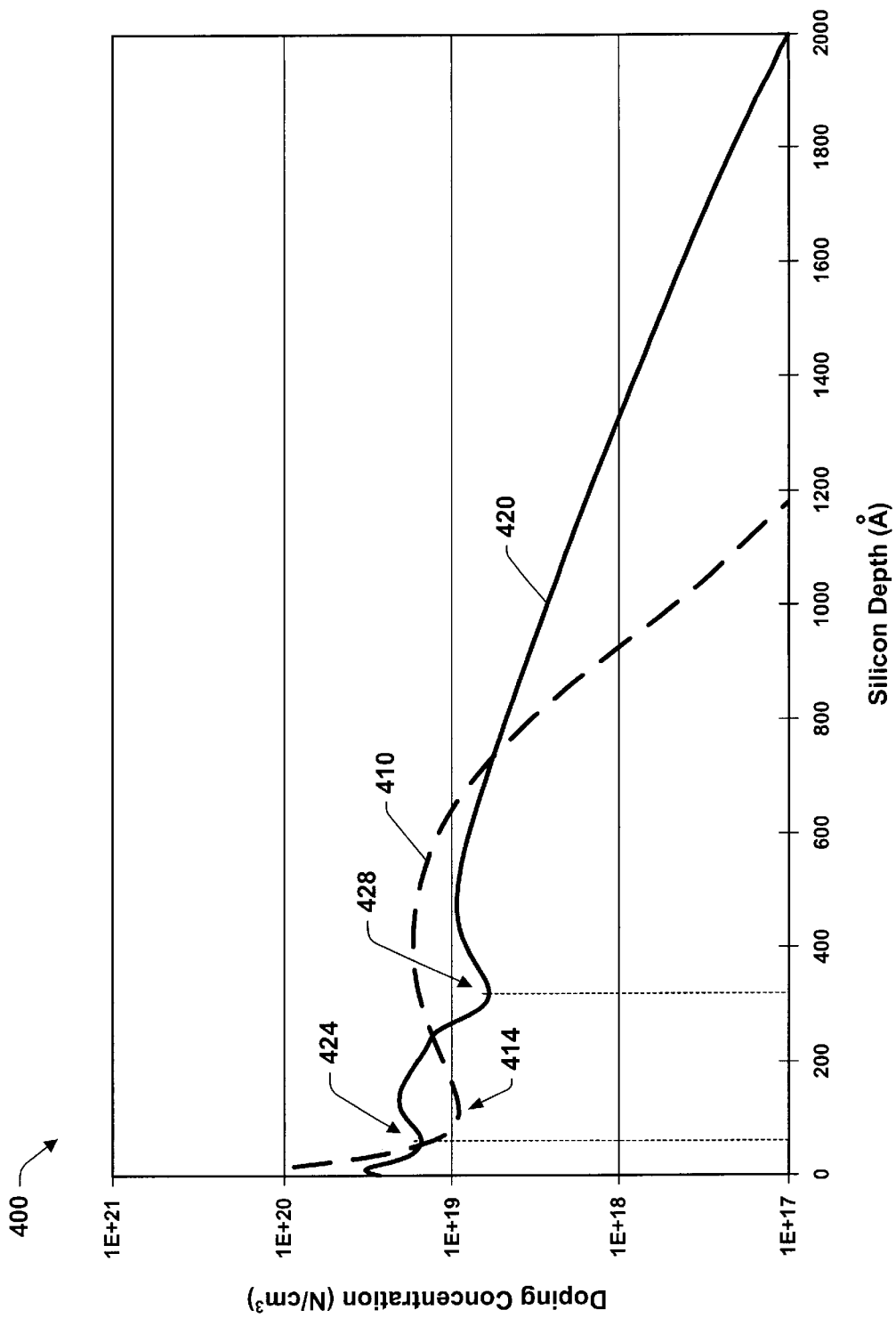
FIG. 7 illustrates a SIMS profile of doping concentration vs. depth within the source/drain region of a device formed in accordance with the present invention, and illustrates the effect of dopant segregation as seen in a retrograde halo profile before and after thermal anneal, the post anneal plot showing a dip and an increase in doping concentration at each layer interface.

FIG. 7 illustrates a SIMS profile of doping concentration vs. depth within the source/drain area of an exemplary device formed in accordance with the present invention. The profile 400 further illustrates the effect of dopant segregation as seen in a retrograde halo profile before and after thermal anneal. Pre-anneal profile 410, illustrates the halo profile as implanted, having a single pre-anneal dip 414 indicating the retrograde doping concentration which increases below the surface before tapering-off toward the full implant depth (e.g., about 1200 Å at the lowest indicated concentration of 1E17 N/cm$^3$). Post-anneal profile 420, illustrates the halo profile after a thermal anneal, having a dip and an increase in doping concentration at each layer interface in accordance with the invention. In one exemplary aspect of the invention, an upper post-anneal dip 424 occurs at (e.g., about 50–100 Å) at the interface of the sharp HDD material layer (e.g., 158 of FIG. 5M) and the first graded HDD material layer (e.g., 142 of FIG. 5M). Further, a lower post-anneal dip 428 occurs at (e.g., about 300–350 Å) at the interface of the first graded HDD material layer (e.g., 142 of FIG. 5M) and the second graded HDD material layer (e.g., 153 of FIG. 5M).

The post-anneal dips 424 and 428 in the doping concentration, illustrate that during the anneal process, the dopant atoms migrate or diffuse from areas of lower concentration, across the junction interface, toward the areas of higher dopant concentration. This dopant migration tendency during the annealing process is referred to as "dopant segregation", or that "there is a preferred region for atom migration". The post-anneal profile 420 also indicates that the thermal anneal causes the dopant atoms to migrate/diffuse down to a depth of (e.g., about 2000 Å at a concentration of 1E17 N/cm$^3$).

The inventor has appreciated that dopant segregation is more pronounced across sharply doped junction interfaces than across gently graded junctions. For example, boron (−) dopants in a channel region of a MOS transistor have a tendency to diffuse across a sharply defined junction to an arsenic (+) S/D HDD region. Thus, the boron dopant "segregates" itself to a "preferred area" in the HDD of the S/D region. If, however, the junction is graded, the electric field strength of the attraction between the As (+), and the B (−) is reduced, slowing the effects of dopant segregation. Therefore, the inventor has sought to minimize the dopant gradient of the subsurface junction interface areas for minimum dopant segregation and minimum Cjbw, while providing a sharp HDD region for minimum channel, HDD, and Rsd resistance. Further, by embedding the sharp HDD portion within the graded HDD portion of the S/D region, these benefits may be enhanced.

It will be appreciated by those skilled in the art that the above methodologies may be employed in forming improved source/drain regions as part of NMOS or PMOS transistor and similar semiconductor device manufacturing processes.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including-a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for forming a source/drain region having both a graded HDD portion and a sharp HDD portion in a semiconductor substrate of a semiconductor device, comprising:

provide a gate structure having an offset spacer on lateral sidewalls thereof over the semiconductor substrate;

implanting a first dopant material in a source/drain area to form a first graded HDD region substantially aligned to the offset spacer and having a first depth in the semiconductor substrate;

forming a sidewall spacer on lateral sidewalls of the gate structure and covering the offset spacer;

implanting a second dopant material in the source/drain area to form a source/drain region substantially aligned to the sidewall spacer and having a second depth;

thermally processing the graded HDD region and the source/drain region with a first anneal;

removing the sidewall spacer and the offset spacer from the sidewalls of the gate structure;

implanting a third dopant material in the source/drain area to form a sharp HDD region substantially aligned to the gate structure and having a third depth; and thermally processing the device with a second anneal after implanting the sharp HDD region.

2. The method of claim 1, further comprising:

implanting a dopant material at an angle around the gate structure to form a halo structure in the source/drain region of the semiconductor substrate and underlying a portion of the gate structure.

3. The method of claim 1, further comprising thermally processing the device immediately after forming the graded HDD material layer.

4. The method of claim 3, wherein thermally processing the device comprises rapid thermal annealing to remove excess silicon interstitials in the graded HDD region.

5. The method of claim 1, wherein the first anneal comprises thermally processing the graded HDD region and the source/drain region at about 950° C. for about 1 second.

6. The method of claim 1, wherein one of the first, second, and third dopant materials are the same dopant type and the substrate comprises an opposite dopant type.

7. The method of claim 1, wherein the second anneal has a higher temperature and a shorter duration than the first anneal.

8. The method of claim 1, wherein the first anneal immediately follows the source/drain region implant and the second anneal immediately follows the sharp HDD region implant.

9. The method of claim 1, wherein the second anneal comprises one of a laser anneal and a flash thermal anneal to control diffusion of the sharp HDD region, thereby causing the sharp HDD region to have a dopant concentration gradient substantially greater than that of the graded HDD region.

10. The method of claim 9, wherein the second anneal comprises thermally processing the device at about 1200° C. for about 1 ms after forming the sharp HDD region.

11. The method of claim 1, further comprising cleaning the device after removing the sidewall spacer and the offset spacer from the gate structure.

12. The method of claim 1, wherein the first depth is less than the third depth and greater than the second depth.

13. The method of claim 1, wherein the graded HDD region extends from a surface of the semiconductor substrate down to a depth of about 300 Å.

14. The method of claim 1, wherein the source/drain region extends from a surface of the semiconductor substrate down to a depth of about 1000 Å.

15. The method of claim 1, wherein the sharp HDD region extends from a surface of the semiconductor substrate down to a depth of less than about 100 Å.

16. The method of claim 1, wherein the implanting of one of the first, second, and third dopant materials comprises implanting via ion implantation.

17. The method of claim 1, wherein the first anneal comprises thermally processing the device at about 1050° C. for about 1 second.

18. The method of claim 17, wherein the second anneal comprises thermally processing the device at about 1200° C. for about 1 ms.

* * * * *